(12) United States Patent
Okubo

(10) Patent No.: US 7,759,843 B2
(45) Date of Patent: Jul. 20, 2010

(54) HIGHLY STABLE PIEZOELECTRIC OSCILLATOR, MANUFACTURING METHOD THEREOF, PIEZOELECTRIC RESONATOR STORAGE CASE, AND HEAT SOURCE UNIT

(75) Inventor: Masaaki Okubo, Chigasaki (JP)

(73) Assignee: Epson Toyocom Corporation, Tokyo (JP)

( * ) Notice: Subject to any disclaimer, the term of this patent is extended or adjusted under 35 U.S.C. 154(b) by 145 days.

(21) Appl. No.: 11/826,950

(22) Filed: Jul. 19, 2007

(65) Prior Publication Data

US 2008/0018409 A1    Jan. 24, 2008

(30) Foreign Application Priority Data

Jul. 20, 2006    (JP) .............................. 2006-198020
Jul. 20, 2006    (JP) .............................. 2006-198021

(51) Int. Cl.
    *H01L 41/053* (2006.01)
(52) U.S. Cl. .................................. 310/346; 310/348
(58) Field of Classification Search ................ 310/346, 310/348, 340, 344, 315; 331/69, 70, 158
    See application file for complete search history.

(56) References Cited

U.S. PATENT DOCUMENTS

| | | | | |
|---|---|---|---|---|
| 5,041,800 A | * | 8/1991 | Long et al. | 331/69 |
| 6,031,318 A | * | 2/2000 | Sunaga et al. | 310/340 |
| 6,147,565 A | * | 11/2000 | Satoh et al. | 331/70 |
| 6,664,864 B2 | * | 12/2003 | Jiles et al. | 331/176 |
| 7,218,036 B2 | * | 5/2007 | Shimodaira et al. | 310/340 |
| 2006/0220636 A1 | * | 10/2006 | Satoh | 324/158.1 |

FOREIGN PATENT DOCUMENTS

| | | |
|---|---|---|
| JP | U-55-61323 | 4/1980 |
| JP | U-60-37923 | 3/1985 |
| JP | U-62-114520 | 7/1987 |
| JP | U-63-126032 | 8/1988 |
| JP | A 1-195706 | 8/1989 |
| JP | A-4-259104 | 9/1992 |
| JP | A 2002-223122 | 8/2002 |
| JP | A-2004-7252 | 1/2004 |
| JP | A-2006-94197 | 4/2006 |

* cited by examiner

*Primary Examiner*—Walter Benson
*Assistant Examiner*—Derek J Rosenau
(74) *Attorney, Agent, or Firm*—Oliff & Berridge, PLC

(57) ABSTRACT

A piezoelectric resonator storage case, includes a piezoelectric resonator stored therein, and a resonator container for storing a metal case. Here, the piezoelectric resonator includes: a piezoelectric resonator body having the metal case and a piezoelectric resonator element which is sealed in the metal case in an air tight manner; and two lead terminals protruding from a bottom of the piezoelectric resonator body.

20 Claims, 4 Drawing Sheets

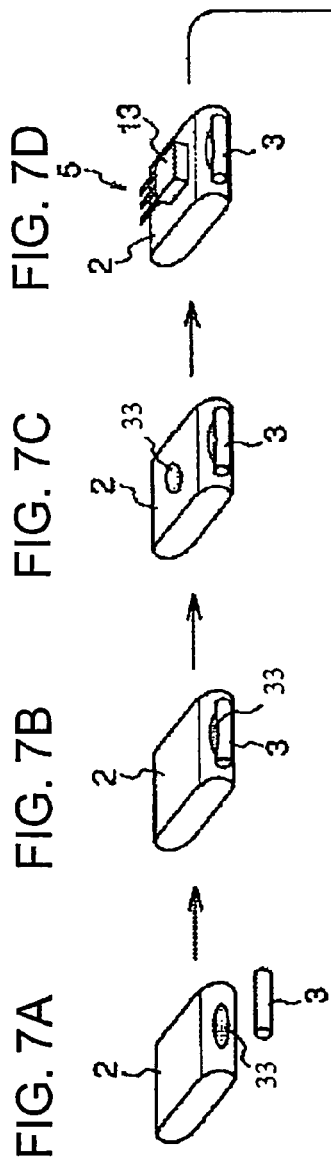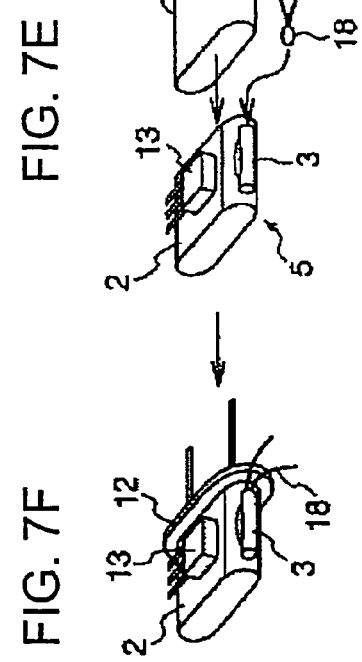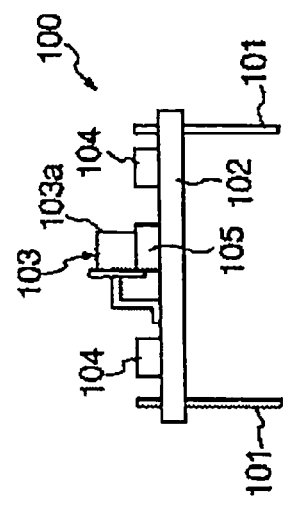
FIG. 8 (Related Art)

1

HIGHLY STABLE PIEZOELECTRIC OSCILLATOR, MANUFACTURING METHOD THEREOF, PIEZOELECTRIC RESONATOR STORAGE CASE, AND HEAT SOURCE UNIT

BACKGROUND

1. Technical Field

The present invention relates to a piezoelectric oscillator used as devices such as a frequency control device, particularly to a storage case suitable for the highly stable piezoelectric oscillator that can output a highly stable frequencies, a heat source unit, an highly stable piezoelectric oscillator and a manufacturing method of the highly stable piezoelectric oscillator.

2. Related Art

Oven-controlled crystal oscillators are commonly known as piezoelectric oscillators, such as crystal oscillators, used as frequency control devices for mobile communication apparatus or transmittal communication apparatus. These oscillators output highly stable frequencies without being effected by external temperature change. In recent years, these highly stable piezoelectric oscillators are required to be smaller and lighter, corresponding to the needs of the market in the above field for various apparatuses to be smaller and lighter For instance, an oven-controlled piezoelectric oscillator is disclosed in JP-A-1-195706. In this oscillator, a first substrate and a second substrate are combined. The first substrate includes an element for oscillator circuits arranged on both sides of the oven that contains a crystal resonator having a hot wire therearound, and the second substrate having an oscillation transistor arranged thereon. At the same time, the substrates are stored in a thermal insulation holder that has a body and a cover that fits an oscillator cover.

However, the piezoelectric oscillator disclosed in JP-A-1-195706 has a two-floor structure in which the two substrates are aligned in the height direction. This involves a problem of the height (thickness) increase of the piezoelectric oscillator.

A crystal oscillator made in consideration of the above problem is disclosed, for instance, in JP-A-2002-223122.

FIG. 8 is a sectional view showing a structure of a crystal oscillator disclosed in JP-A-2002-223122.

A crystal oscillator 100 shown in FIG. 8 includes a crystal resonator 103 and other elements 104 mounted on one print circuit board 102 to which terminals 101 are coupled. Moreover, a power transistor 105 is mounted on the print circuit board 102, and a crystal resonator 103 abuts this power transistor 105.

The crystal oscillator 100 shown in FIG. 8 requires a heat resistance between a metal case 103a of the crystal resonator 103 and the power transistor 105 to be minimum, in the arrangement where the power transistor 105 abuts the metal case 103a of the crystal resonator 103. One way of minimizing the heat resistance is to directly solder the power transistor 105 to the metal case 103a of the crystal resonator 103.

Direct soldering of the power transistor 105 to the metal case 103a of the crystal resonator 103 results in a thermal damage of the crystal resonator 103s. Consequently, this involves a problem of frequency deviation in the crystal oscillator, degrading the long-term stability thereof. In particular, an increasing requirement of recent years for smaller highly stable crystal oscillators, promoted a development of highly stable piezoelectric oscillators that use small crystal resonators. Such small content crystal resonators have had an inherent problem of frequency deviation caused by thermal damage, while it has not in large content crystal resonators.

The crystal oscillator disclosed in JP-A-2002-223122 can be formed thinner than the one disclosed in JP-A-1-195706, since it is formed with a single substrate, and does not have a two-floor structure. Unfortunately, the oscillator cannot be made any thinner, since the power transistor 105 is arranged so as to abut the crystal resonator 103 on the print circuit board 102.

SUMMARY

An advantage of the present invention is to provide a piezoelectric resonator storage case, a heat source unit, a highly stable piezoelectric oscillator, and a method for manufacturing the highly stable piezoelectric oscillator, while minimizing a heat resistance between a metal case of the piezoelectric resonator and a heat source, without a thermally damaging a crystal resonator. Moreover, another advantage of the invention is to provide a thinner highly stable piezoelectric oscillator produced using an oven.

According to a first aspect of the invention, in order to achieve the above advantage, a piezoelectric resonator storage case includes a piezoelectric resonator stored therein and a resonator container for storing a metal case. Here, the piezoelectric resonator includes: a piezoelectric resonator body having the metal case and a piezoelectric resonator element which is sealed in the metal case in an air tight manner; and two lead terminals protruding from a bottom of the piezoelectric resonator body.

The heat resistance is thereby minimized between the piezoelectric resonator storage case and the metal case.

In this case, the piezoelectric resonator storage case further includes a thermosensitive element container for storing a thermosensitive element which senses temperature in a vicinity of the piezoelectric resonator.

An accurate thermosensing of the temperature of the piezoelectric resonator is thereby possible, enabling a right temperature control.

It is desirable that, in this piezoelectric resonator storage case, the thermosensitive element container is coupled to an external face of the resonator container.

The height of the resonator container is thereby reduced.

According to a second aspect of the invention, a heat source unit includes: the piezoelectric resonator storage case according to the above aspect of the invention; and a heat source coupled to the piezoelectric resonator storage case by solder.

Such structure minimizes the heat resistance between the metal case of the piezoelectric resonator and the heat source, since there is no direct soldering of the heat source to the piezoelectric resonator. A thermal damage to the piezoelectric resonator is therefore prevented, by soldering the heat source to the resonator container, prior to storing the piezoelectric resonator in the resonator container.

In this heat source unit, the heat source is a power transistor, which therefore provides a benefit of simplifying the structure of the heat source.

In this case, a highly stable piezoelectric oscillator may include: a print circuit board; the heat source unit according to the second aspect of the invention; a piezoelectric resonator stored in the resonator container of the heat source unit; a temperature sensitive element stored in a temperature sensitive element container of the heat source unit; an oscillator case surrounding the print circuit board and the heat source unit which includes the piezoelectric resonator and the temperature sensitive element; and a terminal coupled to the print circuit board.

Such structure minimizes the heat resistance between the metal case of the piezoelectric resonator and the heat source, since there is no direct soldering of the heat source to the piezoelectric resonator. A thermal damage to the piezoelectric resonator is therefore prevented, by soldering the heat source to the resonator container, prior to storing the piezoelectric resonator in the resonator container. As a result, the highly stable piezoelectric oscillator is prevented from frequency deviation, thereby improving its the long-term stability. In particular, the above structure is suitable for forming the highly stable piezoelectric oscillator using the small-size piezoelectric resonator which has an inherent issue of thermal damage.

In this highly stable piezoelectric oscillator, at least one of the heat source and the piezoelectric resonator which are included in the heat source unit is arranged in a through hole formed in the print circuit board.

In this structure, the thickness of the oscillator is reduced by the amount equal to the thickness of the print circuit board, compared to the common case in which the heat source abuts the piezoelectric resonator on the print circuit board. Moreover, the position of the print circuit board in the height direction can therefore be freely set. This provides a benefit of improving the freedom in the design of the oscillator case that contains the print circuit board, the piezoelectric resonator, and the heat source.

In this highly stable piezoelectric oscillator, at least one of the heat source and the piezoelectric resonator which are included in the heat source unit is arranged in a cutout hole formed in the print circuit board.

In this structure, the thickness of the oscillator is reduced by the amount equal to the thickness of the print circuit board, compared to the common case in which the heat source abuts the piezoelectric resonator on the print circuit board. Moreover, the position of the print circuit board in the height direction can therefore be freely set. This provides a benefit of improving the freedom in the design of the oscillator case that contains the print circuit board, the piezoelectric resonator, and the heat source.

In this case, a method for manufacturing the highly stable piezoelectric oscillator according to the above aspects of the invention may include: coupling the heat source to the resonator container of the heat unit with solder; and thereafter storing the piezoelectric resonator in the resonator container.

The heat source can be coupled to the piezoelectric resonator without thermally damaging the piezoelectric resonator, since the piezoelectric resonator is stored in the resonator container after soldering the heat source to the resonator container of the piezoelectric resonator storage case.

According to a third aspect of the invention, a highly stable piezoelectric oscillator includes: a print circuit board; a piezoelectric resonator coupled to the print circuit board; a heat source coupled to the print circuit board and arranged so as to abut the piezoelectric resonator; an oscillator case surrounding the print circuit board, the piezoelectric resonator, and the heat source; a terminal coupled to the print circuit board; the print circuit board having a portion which defines a through hole in which at least one of the heat source and the piezoelectric resonator is arranged.

In this structure, the thickness of the oscillator is reduced by the amount equal to the thickness of the print circuit board, compared to the common arrangement in which the heat source and the piezoelectric resonator abuts the print circuit board.

Moreover, the position of the print circuit board in the height direction can therefore be freely set. This provides a benefit of improving the freedom in the design of the oscillator case that contains the print circuit board, the piezoelectric resonator, and the heat source.

According to a fourth aspect of the invention, a highly stable piezoelectric oscillator includes: a print circuit board; a piezoelectric resonator coupled to the print circuit board; a heat source coupled to the print circuit board, and arranged so as to abut the piezoelectric resonator; an oscillator case surrounding the print circuit board, the piezoelectric resonator, and the heat source; a terminal coupled to the print circuit board; the print circuit board having a portion which defines a cutout hole in which at least one of the heat source and the piezoelectric resonator is arranged.

In this structure, the thickness of the oscillator is reduced by the amount equal to the thickness of the print circuit board, compared to the common arrangement in which the heat source and the piezoelectric resonator abuts the print circuit board.

Moreover, the position of the print circuit board in the height direction can therefore be freely set. This provides a benefit of improving the freedom in the design of the oscillator case that contains the print circuit board, the piezoelectric resonator, and the heat source.

This highly stable piezoelectric oscillator provides a benefit of simplifying the structure of the heat source by utilizing a power transistor as a heat source.

It is desirable, in this highly stable piezoelectric oscillator, that a castellation electrode be formed at an end edge of the through hole or the cutout hole, so as to couple at least one of the heat source and the piezoelectric resonator to the castellation electrode.

This allows the adjustment of a coupling position of at least one of the heat source and the piezoelectric resonator in height, thereby facilitating an easy abutment of the heat source to the piezoelectric resonator, while making the highly stable piezoelectric oscillator thinner.

It is desirable, in this highly stable piezoelectric oscillator, that an electrode be formed at one end edge of the through hole or the cutout hole, so as to couple at least one of the heat source and the piezoelectric resonator to the electrode.

This simplifies the structure of the electrodes, thereby reducing the cost of the print circuit board, while also simplifying the design of the print circuit board.

It is desirable, in this highly stable piezoelectric oscillator, that an electrode be formed at a step of the through hole or the cutout hole, so as to couple at least one of the heat source and the piezoelectric resonator to the electrode.

With this structure, the highly stable piezoelectric oscillator can be made thinner, while facilitating the abutment of the heat source to the piezoelectric resonator.

It is desirable, in this highly stable piezoelectric oscillator, that an electrode be formed inside a hole provided in an internal end face of the through hole or the cutout hole, so as to couple at least one of the heat source and the piezoelectric resonator to that hole.

With this structure, the highly stable piezoelectric oscillator can be made thinner, while facilitating the abutment of the heat source to the piezoelectric resonator.

BRIEF DESCRIPTION OF THE DRAWINGS

The invention will be described with reference to the accompanying drawings, wherein like numbers reference like elements.

FIG. 7 is a schematic view showing typical manufacturing steps of a highly stable piezoelectric oscillator according to aspects of the invention.

FIG. 8 is a sectional view showing a structure of a crystal oscillator in related art.

DESCRIPTION OF EXEMPLARY EMBODIMENTS

Embodiments of a piezoelectric resonator storage case used for a highly reliable piezoelectric oscillator according to aspects of the invention will now be described.

Figure 1:
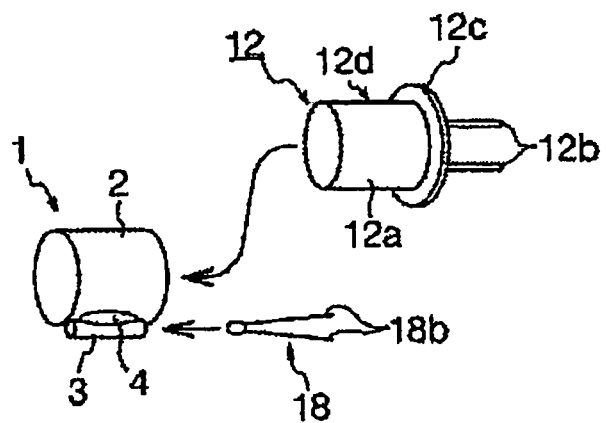
FIG. 1 is a drawing showing a structure of a storage case used for a highly stable piezoelectric oscillator according to aspects of the invention.

FIG. 1 is a drawing showing a structure of the piezoelectric resonator storage case used for a highly stable piezoelectric oscillator according to aspects of the invention.

A storage case 1 (the piezoelectric resonator storage case) shown in FIG. 1 includes a resonator container 2 formed with metal for storing a crystal resonator (a piezoelectric resonator) 12, and a thermistor container (thermosensitive element container) 3 that stores a thermistor (temperature sensitive element) 18. The thermistor container 3 is coupled to the side face of the resonator container 2 by solder 4. The storage case 1 does not require to be metallic as long as the material thereof has good heat conductance.

The internal diameter of the resonator container 2 is slightly larger than the external diameter shaped by an outer surface of a metal case 12a of the crystal resonator 12. Containing the crystal resonator 12 within the resonator container 2 allows abutting (adhere tightly) the metal case 12a of the crystal resonator 12 to the resonator container 2, thereby increasing the thermal bonding between the resonator container 2 and the crystal resonator 12.

The thermistor container 3 stores the thermistor 18 therein. Here, the thermistor 18 is fixed inside the thermistor container 3 by filling in a silicon resin that has good heat conductance.

The crystal resonator 12 includes a crystal resonator body 12d and two lead terminals 12b. The crystal resonator body 12d includes an un-illustrated crystal resonator element (piezoelectric resonator element) sealed in the metal case 12a in an air tight manner. The lead terminals 12b protrude from a bottom 12c of the metal case 12a.

The embodiments of a highly stable crystal oscillator according to the aspects of the invention will now be described, based on the structure of the piezoelectric resonator storage case described above. In these embodiments, a highly stable crystal oscillator is described as an example of the highly stable piezoelectric oscillator.

Figure 2A:
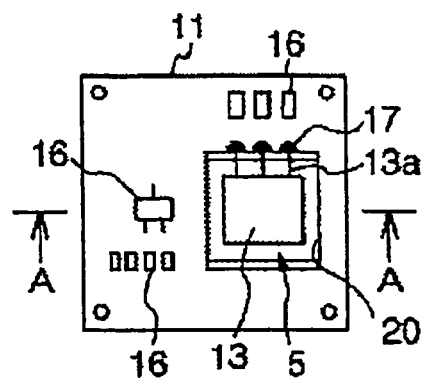
FIGS. 2A and 2B are drawings showing a structure of a highly stable crystal oscillator according to one embodiment of the invention.
Figure 2B:
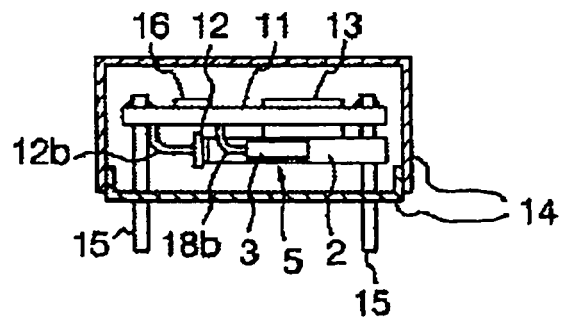

FIGS. 2A and 2B are drawings showing a structure of a highly stable crystal oscillator according to a first embodiment of the invention. FIG. 2A is a top view, and FIG. 2B is a longitudinal sectional view cut along a line A-A shown in FIG. 2A. Drawing of an oscillator case is omitted in FIGS. 2A and 2B, in order to facilitate the illustration of the interior of the highly stable crystal oscillator.

The highly stable crystal oscillator shown in FIGS. 2A and 2B includes: a print circuit board 11; a crystal resonator (piezoelectric resonator) 12 that is coupled to the print circuit board 11; a power transistor (heat source) 13 that heats the crystal resonator 12 coupled to the print circuit board 11; an oscillator case 14 that surrounds at least the print circuit board 11, the crystal resonator 12, and the power transistor 13; and terminals 15 coupled to the print circuit board 11.

Various components 16 are mounted on the print circuit board 11, so as to configure an oscillation circuit and a heat control circuit together with the crystal resonator 12 and the power transistor 13. The thermistor 18 is also arranged on the print circuit board 11, so as to detect the temperature of the crystal resonator 12.

In the first embodiment, a heat source unit 5 is formed by coupling the power transistor 13 to the storage case 1 with soldering. The crystal resonator 12 and the thermistor 18 are respectively stored in the resonator container 2 and the thermistor container 3 which are included in the heat source unit 5. At this time, the crystal resonator 12 and the thermistor 18 stored in the heat source unit 5 are arranged beneath the print circuit board 11, and the lead terminals 12b of the crystal resonator 12 and lead terminals 18b of the thermistor 18 are coupled to a predetermined land (a part of the interconnection pattern) on the print circuit board 11. The lead terminals 12b of the crystal resonator 12 are bent, so that the heat source unit 5 containing the crystal resonator 12 becomes approximately parallel to the print circuit board 11.

Figure 3:
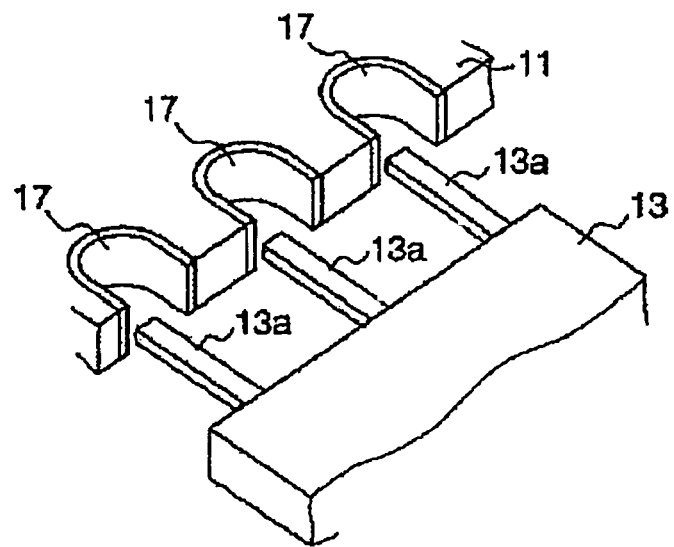
FIG. 3 is a drawing showing a structure of electrodes to which lead terminals of a power transistor are coupled.

A through hole 20 is formed in a planer region in which the print circuit board 11 overlaps the heat source unit 5 containing the crystal resonator 12. The power transistor 13 is arranged inside this through hole 20. At this time, as shown in FIG. 3, lead terminals 13a of the power transistor 13 are soldered to electrodes (hereafter referred to as "castellation electrodes") 17 formed at the end edge of the through hole 20. Each castellation electrode has a castellation structure that includes a top (or back) face electrode and a side surface electrode.

Such structure reduces the heat resistance between the metal case 12a of the crystal resonator 12 and the power transistor 13 to the minimum, without directly soldering the power transistor 13 to the crystal resonator 12. A thermal damage to the crystal resonator 12 is prevented by forming the heat source unit 5, by soldering the power transistor 13 to the storage case 1 prior to storing the crystal resonator 12 in the storage case 1. As a result, oscillation frequency deviation is prevented in the highly stable piezoelectric oscillator, thereby improving the long-term stability of the oscillator. In particular, the above structure is suitable for forming the highly stable piezoelectric oscillator using the small-content crystal resonator 12 which has an inherent issue of thermal damage.

In the first embodiment, the height (thickness) of the highly stable crystal oscillator is decreased by a value equal to the thickness of the print circuit board 11, when compared to the arrangement in which the power transistor 13 abuts the crystal resonator 12 on the print circuit board 11. This is achieved by arranging the power transistor 13 inside the through hole 20 of the print circuit board 11. In other words, it is possible to make the highly stable crystal oscillator thinner.

Moreover, using the power transistor 13 as the heat source makes the structure of the heat source simpler, compared to the case of, for instance, wrapping the crystal resonator 12 with resistance lines. Moreover, the position of the power transistor 13 is easily adjusted in height, by coupling the lead terminals 13a of the power transistor 13 to the castellation electrodes 17 formed on the end edge of the through hole 20.

Figure 4A:
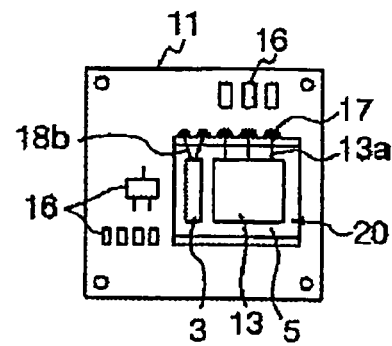
FIGS. 4A and 4B are drawings showing a structure of a highly stable crystal oscillator according to another embodiment of the invention.
Figure 4B:
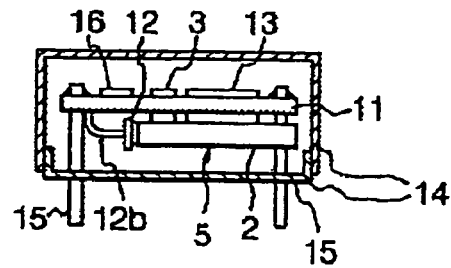

FIGS. 4A and 4B are top view showing a structure of a highly stable crystal oscillator according to a second embodiment of the invention. Here, the same signs and numerals are used for the same parts as in FIG. 1, and their descriptions are omitted.

The highly stable crystal oscillator shown in FIGS. 4A and 4B includes the thermistor container 3 coupled to a surface to which the power transistor 13 is soldered, i.e., on the top face of the resonator container 2, while, in the highly stable crystal oscillator shown in FIG. 2, the thermistor container 3 is coupled to the side surface of the resonator container 2. Coupling the thermistor container 3 with the top face of the resonator container 2 provides a benefit of making the assembly of the heat source unit 5 easier, compared to the case of coupling the thermistor container 3 to the side face of the resonator container 2.

Figure 5:
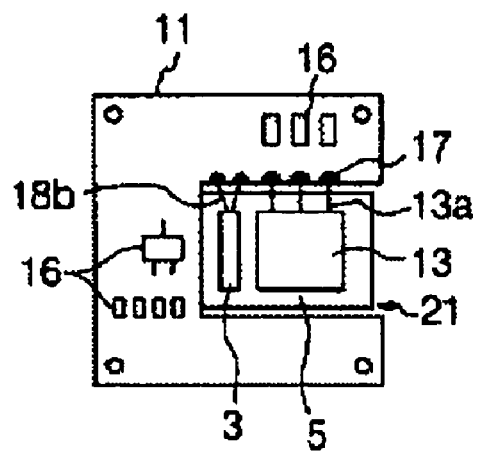
FIG. 5 is a top view showing a structure of a highly stable crystal oscillator according to another embodiment of the invention.

FIG. 5 is a top view showing a structure of a highly stable crystal oscillator according to a third embodiment of the invention. Here, the same signs and numerals are used for the same parts as in FIGS. 4A and 4B, and their descriptions are omitted. The longitudinal sectional view is omitted since it is the same as that of FIG. 4B.

The highly stable crystal oscillator shown in FIG. 5 includes a cutout hole 21, which has a shape approximately rectangular with one side missing, formed in a planer region in which the print circuit board 11 overlaps the heat source unit 5 containing the crystal resonator 12. Here, the lead terminals 12b of the crystal resonator 12 are arranged being bent. The power transistor 13 of the heat source unit 5 is arranged inside this cutout hole 21. In this case, the lead terminals 13a of the power transistor 13 are also soldered to the castellation electrodes 17 formed at the end edge of the cutout hole 21.

Such structure reduces the heat resistance between the metal case 12a of the crystal resonator 12 and the power transistor 13 to the minimum, without directly soldering the power transistor 13 to the crystal resonator 12. The effect of such highly stable crystal oscillator is the same as that of the first embodiment, since a thermal damage of the crystal resonator 12 is prevented by soldering the power transistor 13 to the storage case 1, prior to storing the crystal resonator 12 in the storage case 1. This case also allows the realization of the thinner highly stable crystal oscillator.

In the third embodiment, the thermistor container 3 is connected on the top face of the resonator container 2. Needless to say, the thermistor container 3 may also be coupled to the side surface of the resonator container 2.

In this embodiment, the description is made for the case of connecting the lead terminals of the power transistor 13 to the castellation electrodes 17. This is merely one of the examples, and a structure in which the electrodes are coupled with the lead terminals of the power transistor may vary.

Figure 6A:
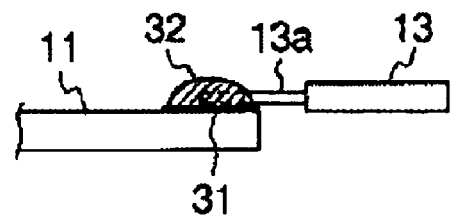
FIGS. 6A to 6C are drawings showing other examples of the structure of the electrode to which lead terminals of a power transistor are coupled.
Figure 6B:
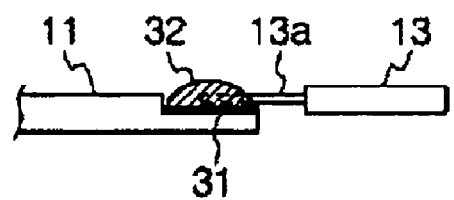
Figure 6C:
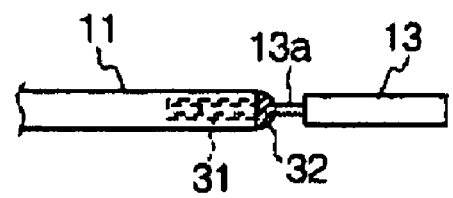

FIGS. 6A to 6C are drawings showing other examples of the structure of the electrode to which lead terminals of a power transistor are coupled.

Referring now to FIG. 6A, electrodes 31 are formed on one end edge of the through hole 20 or the cutout hole 21 in the print circuit board 11, so that the lead terminals 13a of the power transistor 13 are connected thereto with solder 32. This simplifies the structure of the electrodes, thereby reducing the cost of the print circuit board 11, while also simplifying the design of the print circuit board 11.

Referring now to FIG. 6B, a step is formed on the end edge of the through hole 20 or the cutout hole 21 in the print circuit board 11, and the electrodes 31 are formed on the step, so that the lead terminals 13a of the power transistor 13 are coupled to the electrodes 31 with the solder 32. This allows the arranging of the power transistor 13 to be closer to the bottom face of the print circuit board 11, compared to the case shown in FIG. 6A. The highly stable crystal oscillator can thereby be made thinner than the one in FIG. 6A. At the same time, the power transistor 13 can be made to abut the crystal resonator 12 arranged beneath the print circuit board 11.

Referring now to FIG. 6C, a hole is formed in an internal end face of the through hole 20 or the cutout hole 21 in the print circuit board 11, and the lead terminals 13a of the power transistor 13 are inserted to the hole, so as to connect the power transistor 13 to the electrodes 31 with the solder 32. This provides a similar effect as that of the structure referred in FIG. 6B.

Typical manufacturing steps of the highly stable piezoelectric oscillator according to the embodiments of the invention will now be described.

FIG. 7 is a schematic view showing typical manufacturing steps of a highly stable piezoelectric oscillator according to the embodiments.

Here, the resonator container 2 and the thermistor container 3 are first prepared as shown in Fig.7A, and cream solder 33 is coated between the resonator container 2 and the thermistor container 3. Subsequently, as shown in Fig.7B, the thermistor container 3 is set at a location where the cream solder 33 is coated, and thereafter the cream solder 33 for setting the power transistor 13 is coated on a top face of the resonator container 2, as shown in FIG. 7C. The power transistor 13 is then set on the top face of the resonator container 2 as shown in Fig.7D for reflow soldering. Consequently, the heat source unit 5 including the power transistor 13 soldered thereon is produced. Thereafter, as shown in Figs.7E and 7F, the crystal resonator 12 and the thermistor 18 are respectively stored in the resonator container 2 and the thermistor container 3 which are included in the heat source unit 5.

In the above method, the power transistor 13 is soldered prior to storing the crystal resonator 12 in the resonator container 2 of the heat source unit 5. As a result, the heat resistance between the crystal resonator 12 and the power transistor 13 is kept to the minimum without thermally damaging the crystal resonator 12.

The power transistor 13 and the thermistor container 3 are soldered on the resonator container 2 in the same step. Storing the crystal resonator 12 into the resonator container 2 and storing the thermistor 18 into the thermistor container 3 are also performed in the same step. Consequently, workability of those steps improves and the entire productivity increases. Coupling the thermistor container 3 to the top face of the resonator container 2 makes the assembly of a resonator unit easier, compared to the case of coupling the thermistor container 3 to the side face of the resonator container 2, thereby further increasing the entire productivity.

In these embodiments, the through hole 20 and the cutout hole 21 are formed in the print circuit board 11 and the power transistor 13 is arranged in the through hole 20 or the cutout hole 21. The crystal resonator 12 stored in the storage case 1 may also be arranged in the location of the through hole 20 or the cutout hole 21. In such case, the lead terminals 12b of the crystal resonator 12 are coupled to the castellation electrodes 17 formed on the end edge of the through hole 20 or the cutout hole 21. As described, forming the through hole 20 and the cutout hole 21 in the print circuit board 11, so as to arrange the storage case 1 containing the power transistor 13 or the crystal resonator 12 within the through hole 20 or a cutout hole 21, enables setting the position of the print circuit board 11 freely in the height direction. This provides a benefit of improving the freedom in designing the oscillator case 14 that stores the print circuit board 11, the crystal resonator 12, and the power transistor 13.

In these embodiments, the power transistor 13 is utilized as an example of the power transistor 13 as a heat source. However, elements such as a resistance line, a chip resistor, and a peltiert element may also be used.

The highly stable crystal oscillator using crystal as a piezoelectric material is described in these embodiments. The present invention may also be applied to other highly stable piezoelectric oscillator using piezoelectric materials other than crystal.

The structure of the highly stable crystal oscillator described in these embodiments are merely an example, and the structure of the highly stable piezoelectric oscillator of the invention is not limited thereto.

What is claimed is:

1. A piezoelectric resonator storage case, comprising:
   a piezoelectric resonator stored therein;
   a resonator container for storing a metal case, the resonator container enclosing all sides of the metal case; and
   a thermosensitive element container for storing a thermosensitive element and casing of the thermosensitive element, the thermosensitive element senses temperature in a vicinity of the piezoelectric resonator, the thermosensitive element container directly coupled to the resonator container;
   the piezoelectric resonator including:
   a piezoelectric resonator body having the metal case and a piezoelectric resonator element which is sealed in the metal case in an air tight manner; and
   two lead terminals protruding from a bottom of the piezoelectric resonator body.

2. The piezoelectric resonator storage case according to claim 1, the thermosensitive element container being coupled to an external face of the resonator container.

3. A heat source unit, comprising:
   the piezoelectric resonator storage case according to claim 1; and
   a heat source coupled to the piezoelectric resonator storage case by solder.

4. The heat source unit according to claim 3, the heat source being a power transistor.

5. A highly stable piezoelectric oscillator, comprising:
   a print circuit board;
   the heat source unit recited in claim 3;
   an oscillator case surrounding the print circuit board and the heat source unit which includes the piezoelectric resonator and the thermosensitive element; and
   a terminal coupled to the print circuit board.

6. The highly stable piezoelectric oscillator according to claim 5, at least one of the heat source and the piezoelectric resonator which are included in the heat source unit being arranged in a through hole formed in the print circuit board.

7. The highly stable piezoelectric oscillator according to claim 5, at least one of the heat source and the piezoelectric resonator which are included in the heat source unit being arranged in a cutout hole formed in the print circuit board.

8. A method for manufacturing the highly stable piezoelectric oscillator recited in claim 5, comprising:
   coupling the heat source to the resonator container of the heat unit with solder; and
   thereafter storing the piezoelectric resonator in the resonator container.

9. A highly stable piezoelectric oscillator, comprising:
   a print circuit board;
   a piezoelectric resonator coupled to the print circuit board;
   a heat source coupled to the print circuit board, and arranged so as to abut the piezoelectric resonator;
   an oscillator case surrounding the print circuit board, the piezoelectric resonator, and the heat source; and
   a terminal coupled to the print circuit board;
   the print circuit board having a portion which defines a through hole in which at least one of the heat source and the piezoelectric resonator is arranged, and
   the print circuit board completely surrounding the through hole.

10. The highly stable piezoelectric oscillator according to claim 9, the heat source being a power transistor.

11. The highly stable piezoelectric oscillator according to claim 9, a castellation electrode being formed at an end edge of the print circuit board, so as to couple at least one of the heat source and the piezoelectric resonator to the castellation electrode.

12. The highly stable piezoelectric oscillator according to claim 9, an electrode being formed at one end edge of the through hole of the print circuit board, so as to couple the at least one of the heat source and the piezoelectric resonator to the electrode.

13. The highly stable piezoelectric oscillator according to claim 9, an electrode being formed at a step provided at one end edge of the through hole of the print circuit board, so as to couple at least one of the heat source and the piezoelectric resonator to the electrode.

14. The highly stable piezoelectric oscillator according to claim 9, an electrode being formed inside a hole provided in an internal end face of the through hole of the print circuit board, so as to couple at least one of the heat source and the piezoelectric resonator to the electrode.

15. The highly stable piezoelectric oscillator according to claim 9, at least one of the heat source and the piezoelectric resonator being arranged within the through hole and spaced from the print circuit board.

16. A highly stable piezoelectric oscillator, comprising:
   a print circuit board;
   a piezoelectric resonator coupled to the print circuit board;
   a heat source coupled to the print circuit board, and arranged so as to abut the piezoelectric resonator;
   an oscillator case surrounding the print circuit board, the piezoelectric resonator, and the heat source; and
   a terminal coupled to the print circuit board;
   the print circuit board having a portion which defines a cutout hole in which at least one of the heat source and the piezoelectric resonator is arranged, and
   the print circuit board surrounding at least three sides of the cutout hole.

17. The highly stable piezoelectric oscillator according to claim 16, an electrode being formed at one end edge of the cutout hole of the print circuit board, so as to couple the at least one of the heat source and the piezoelectric resonator to the electrode.

18. The highly stable piezoelectric oscillator according to claim 16, an electrode being formed at a step provided at one end edge of the cutout hole of the print circuit board, so as to couple at least one of the heat source and the piezoelectric resonator to the electrode.

19. The highly stable piezoelectric oscillator according to claim 16, an electrode being formed inside a hole provided in an internal end face of the cutout hole of the print circuit board, so as to couple at least one of the heat source and the piezoelectric resonator to the electrode.

20. The highly stable piezoelectric oscillator according to claim 16, at least one of the heat source and the piezoelectric resonator being arranged within the cutout hole and spaced from the print circuit board.

* * * * *